United States Patent
Han et al.

(10) Patent No.: US 8,928,158 B2
(45) Date of Patent: Jan. 6, 2015

(54) EPOXY RESIN COMPOSITION FOR ENCAPSULATING SEMICONDUCTOR DEVICE AND SEMICONDUCTOR DEVICE ENCAPSULATED WITH THE SAME

(75) Inventors: Seung Han, Uiwang-si (KR); Ju Mi Kim, Uiwang-si (KR); Sung Su Park, Uiwang-si (KR); Eun Jung Lee, Uiwang-si (KR)

(73) Assignee: Cheil Industries Inc., Gumi-si, Kyeongsangbuk-do (KR)

( * ) Notice: Subject to any disclaimer, the term of this patent is extended or adjusted under 35 U.S.C. 154(b) by 288 days.

(21) Appl. No.: 13/478,138

(22) Filed: May 23, 2012

(65) Prior Publication Data

US 2012/0302667 A1 Nov. 29, 2012

(30) Foreign Application Priority Data

May 23, 2011 (KR) .................. 10-2011-0048753

(51) Int. Cl.
*H01L 23/29* (2006.01)
*C08L 63/04* (2006.01)
*C08G 59/32* (2006.01)
*C09D 163/04* (2006.01)
*C09J 163/04* (2006.01)

(52) U.S. Cl.
CPC .......... *H01L 23/295* (2013.01); *C08G 59/3218* (2013.01); *C09D 163/04* (2013.01); *C09J 163/04* (2013.01); *C08L 63/04* (2013.01)
USPC ........... 257/793; 257/789; 257/795; 523/427; 523/428; 523/443; 523/466; 525/524

(58) Field of Classification Search
None
See application file for complete search history.

(56) References Cited

U.S. PATENT DOCUMENTS

| 2002/0053302 A1* | 5/2002 | Endo et al. .............. 106/287.22 |
| 2007/0060720 A1* | 3/2007 | Kiuchi et al. ................. 525/524 |
| 2008/0200636 A1* | 8/2008 | Nakanishi et al. ........... 528/105 |

* cited by examiner

*Primary Examiner* — Michael J Feely
(74) *Attorney, Agent, or Firm* — Lee & Morse, P.C.

(57) ABSTRACT

An epoxy resin composition for encapsulating a semiconductor device includes a curing agent, a curing accelerator, inorganic fillers, and an epoxy resin, the epoxy resin including a first resin represented by Formula 1:

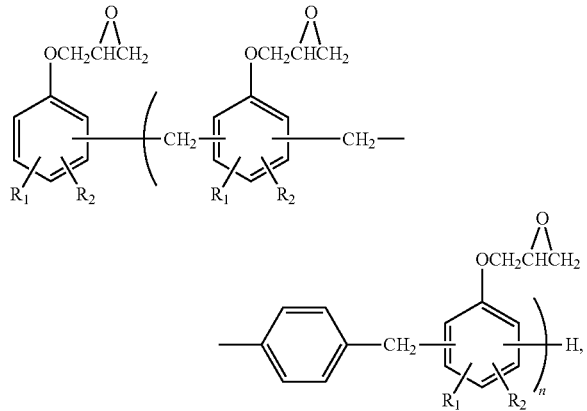

wherein R1 and R2 are each independently hydrogen or a C1 to C4 linear or branched alkyl group, and n is a value from 1 to 9 on average.

13 Claims, No Drawings

EPOXY RESIN COMPOSITION FOR ENCAPSULATING SEMICONDUCTOR DEVICE AND SEMICONDUCTOR DEVICE ENCAPSULATED WITH THE SAME

BACKGROUND

1. Field

Embodiments relate to an epoxy resin composition for encapsulating a semiconductor device and a semiconductor device encapsulated with the same.

2. Description of the Related Art

Generally, an epoxy resin composition used for encapsulating a semiconductor device has flame retardancy, which generally means a UL94 flammability rating of about V0 in the semiconductor industry. To obtain flame retardancy, an epoxy resin composition for encapsulating a semiconductor device may be prepared using halogen and flame retardants.

SUMMARY

Embodiments are directed to an epoxy resin composition for encapsulating a semiconductor device, the composition including a curing agent, a curing accelerator, an inorganic filler, and an epoxy resin. The epoxy resin may include a first resin represented by Formula 1:

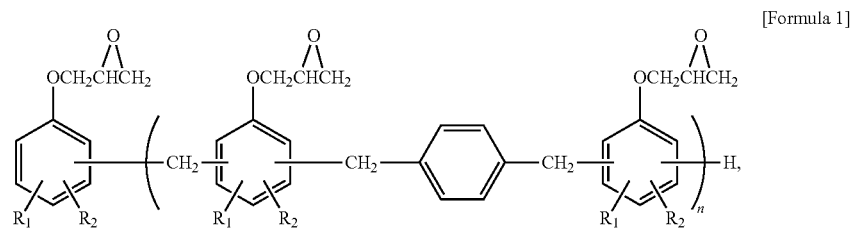

[Formula 1]

wherein $R_1$ and $R_2$ are each independently hydrogen or a C1 to C4 linear or branched alkyl group, and n is a value from 1 to 9 on average.

The first resin represented by Formula 1 may have a structure represented by Formula 2:

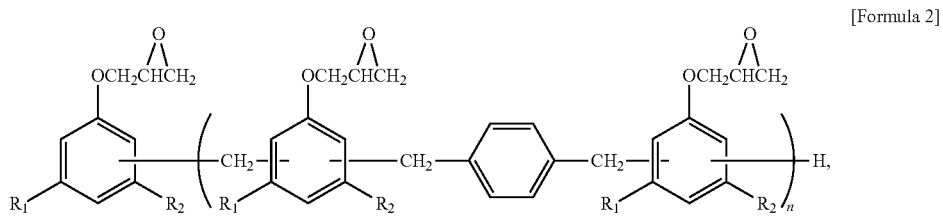

[Formula 2]

wherein $R_1$ and $R_2$ each independently are hydrogen or a C1 to C4 linear or branched alkyl group, and n is a value from 1 to 9 on average.

The first resin represented by Formula 1 may have a structure represented by Formula 3:

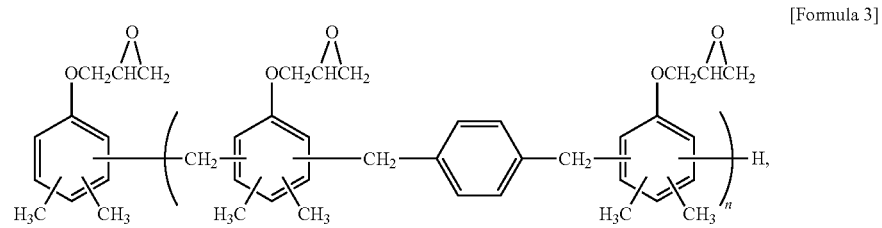

[Formula 3]

wherein n is a value from 1 to 9 on average.

The first resin represented by Formula 1 may have a structure represented by Formula 4:

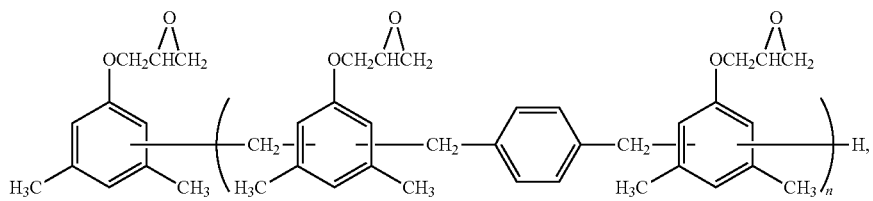

wherein n is a value from 1 to 9 on average.

The first resin represented by Formula 1 may be present in an amount of about 1 to about 13 wt % in the composition.

The epoxy resin may include about 30 wt % or more of the first resin represented by Formula 1.

The epoxy resin may further include a second resin selected from the group of a phenol aralkyl epoxy resin, a biphenyl epoxy resin, a xyloc epoxy resin, an epoxy resin obtained by epoxidation of a condensate of a phenol or an alkyl phenol with hydroxybenzaldehyde, a phenol novolac epoxy resin, a cresol novolac epoxy resin, a multifunctional epoxy resin, a naphthol novolac epoxy resin, a bisphenol A/bisphenol F/bisphenol AD novolac epoxy resin, a bisphenol A/bisphenol F/bisphenol AD glycidyl ether, a bishydroxybiphenyl epoxy resin, a dicyclopentadiene epoxy resin, a polycyclic aromatic modified epoxy resin, a bisphenol A epoxy resin, an ortho-cresol novolac epoxy resin, and a naphthalene epoxy resin.

The composition may include about 1 to about 13 wt % of the epoxy resin, about 1.5 to about 10 wt % of the curing agent, about 0.001 to about 1.5 wt % of the curing accelerator, and about 78 to about 94 wt % of the inorganic filler.

The curing agent may include one or more of a phenol aralkyl phenolic resin, a xyloc phenolic resin, a phenol novolac phenolic resin, a cresol novolac phenolic resin, a naphthol phenolic resin, a terpene phenolic resin, a multifunctional phenolic resin, a polycyclic aromatic phenolic resin, a dicyclopentadiene phenolic resin, a terpene modified phenolic resin, a dicyclopentadiene modified phenolic resin, a novolac phenolic resin synthesized from bisphenol A and cresol, a polyhydric phenolic compound including tris(hydroxyphenyl)methane, dihydroxybiphenyl, an acid anhydride, and an aromatic amine.

The curing accelerator may include one or more of benzyldimethylamine, triethanolamine, triethylenediamine, dimethylaminoethanol, tri(dimethylaminomethyl)phenol, 2,2-(dimethylaminomethyl)phenol, 2,4,6-tris(diaminomethyl)phenol, a salt of tri-2-ethylhexanoic acid, chromium acetylacetonate, zinc acetylacetonate, nickel acetylacetonate, tris-4-methoxyphosphine, tetrabutylphosphonium bromide, butyltriphenylphosphonium bromide, phenylphosphine, diphenylphosphine, triphenylphosphine, triphenylphosphine triphenylborane, a triphenylphosphine-1,4-benzoquinone adduct, 2-methylimidazole, 2-phenylimidazole, 2-aminoimidazole, 2-methyl-1-vinylimidazole, 2-ethyl-4-methylimidazole, 2-heptadecylimidazole, tetraphenylphosphonium-tetraphenylborate, triphenylphosphine tetraphenylborate, a tetraphenylboron salt, trifluoroborane-n-hexylamine, trifluoroborane monoethylamine, tetrafluoroborane triethylamine, tetrafluoroborane amine, a salt of 1,5-diazabicyclo[4.3.0]non-5-ene (DBN), a salt of 1,8-diazabicyclo[5.4.0]undec-7-ene (DBU), and a phenol novolac resin salt.

The composition may consist essentially of:

about 3 to about 7.5 wt % of the first resin represented by Formula 1, the first resin represented by Formula 1 having a structure represented by Formula 4:

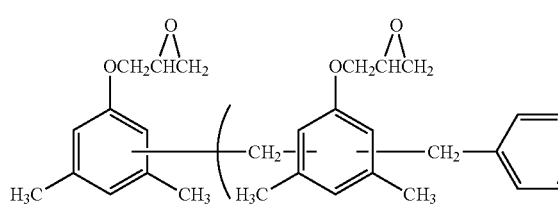

wherein n is a value from 1 to 9 on average;

about 2 to about 8 wt % of the curing agent, the curing agent being a resin represented by Formula 9:

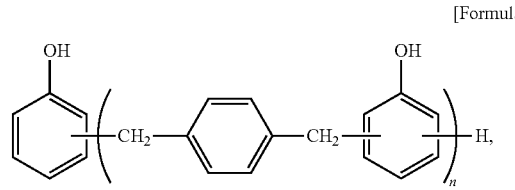

wherein n is a value from 1 to 7 on average;

about 0.01 to about 1 wt % of triphenylphosphine;

about 82 to about 92 wt % of a mixture of: spherical fused silica having an average particle size of 18 μm and spherical fused silica having an average particle size of 0.5 μm at a weight ratio of about 9:1; and about 0.1 wt % to about 5 wt % of a mixture of: a colorant, a release agent, mercaptopropyltrimethoxysilane, and methyltrimethoxysilane.

The composition may consists essentially of:

about 3 to about 7.5 wt % of the first resin represented by Formula 1, the first resin represented by Formula 1 having a structure represented by Formula 4:

[Formula 4]

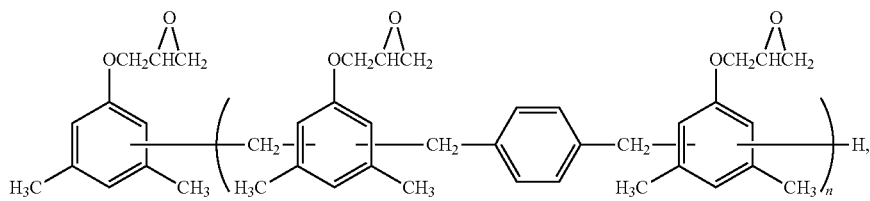

wherein n is a value from 1 to 9 on average;
about 2 to about 8 wt % of the curing agent, the curing agent being a resin represented by Formula 8:

[Formula 8]

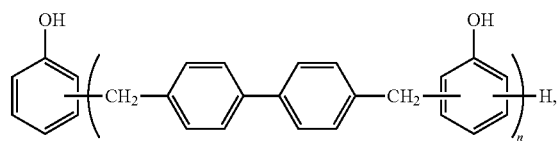

wherein n is a value from 1 to 7 on average;
about 0.01 to about 1 wt % of triphenylphosphine;
about 82 to about 92 wt % of a mixture of: spherical fused silica having an average particle size of 18 μm and spherical fused silica having an average particle size of 0.5 μm at a weight ratio of about 9:1; and
about 0.1 wt % to about 5 wt % of a mixture of: a colorant, a release agent, mercaptopropyltrimethoxysilane, and methyltrimethoxysilane.

The composition may consist essentially of:
about 3 to about 7.5 wt % of a mixture of: the first resin represented by Formula 1 and a second resin, the first resin represented by Formula 1 having a structure represented by Formula 4:

[Formula 4]

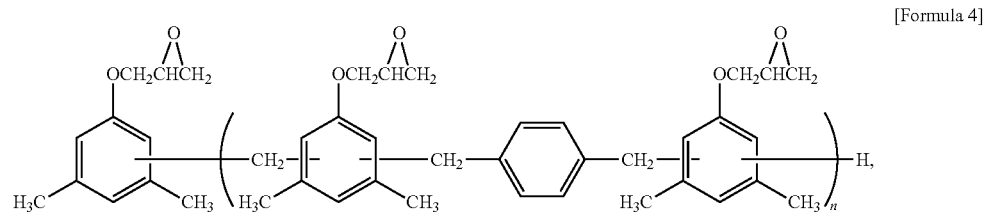

wherein n is a value from 1 to 9 on average,
the second resin having a structure represented by Formula 5 or Formula 6:

[Formula 5]

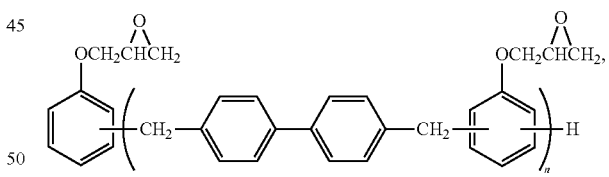

wherein n is a value from 1 to 7 on average,

[Formula 6]

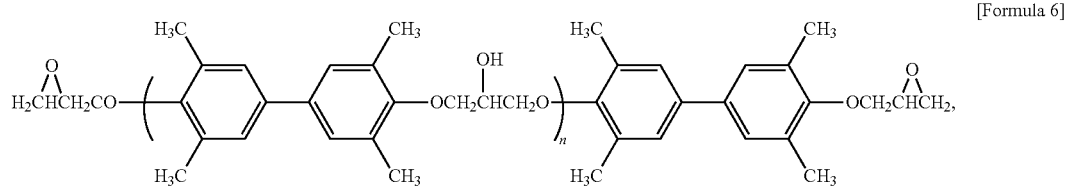

wherein n is a value from 1 to 7 on average;
about 2 to about 8 wt % of the curing agent, the curing agent being a mixture of: a resin represented by Formula 8 and a resin represented by Formula 9:

[Formula 8]

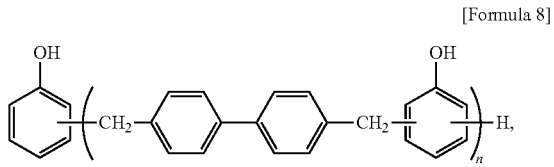

wherein n is a value from 1 to 7 on average,

[Formula 9]

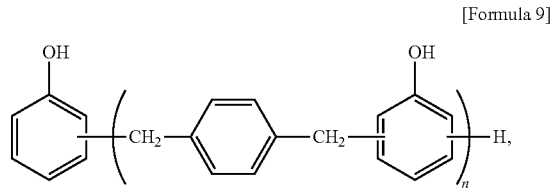

wherein n is a value from 1 to 7 on average;

about 0.01 to about 1 wt % of triphenylphosphine;

about 82 to about 92 wt % of a mixture of: spherical fused silica having an average particle size of 18 μm and spherical fused silica having an average particle size of 0.5 μm at a weight ratio of about 9:1; and about 0.1 wt % to about 5 wt % of a mixture of: a colorant, a release agent, mercaptopropyltrimethoxysilane, and methyltrimethoxysilane.

Embodiments are also directed to a semiconductor device encapsulated with an encapsulant formed from the composition according to an embodiment.

DETAILED DESCRIPTION

Korean Patent Application No. 10-2011-0048753, filed on May 23, 2011, in the Korean Intellectual Property Office, and entitled: "Epoxy Resin Composition for Encapsulating Semiconductor Device and Semiconductor Device Encapsulated with the Same," is incorporated by reference herein in its entirety.

An epoxy resin composition for encapsulating a semiconductor device according to an embodiment includes an epoxy resin, a curing agent, a curing accelerator, and an inorganic filler.

The epoxy resin may include an aromatic hydrocarbon modified novolac epoxy resin, which may be represented by Formula 1:

[Formula 1]

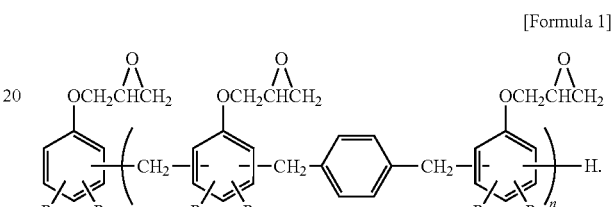

In Formula 1, R1 and R2 may each independently be hydrogen or a C1 to C4 linear or branched alkyl group, and n may have a value from 1 to 9 on average.

In the epoxy resin in Formula 1, R1 and R2 may be disposed at ortho, meta, or para positions of the aromatic hydrocarbon. In an implementation, R1 and R2 may be disposed at meta positions of the aromatic hydrocarbon, and accordingly the epoxy resin may have a structure represented by Formula 2:

[Formula 2]

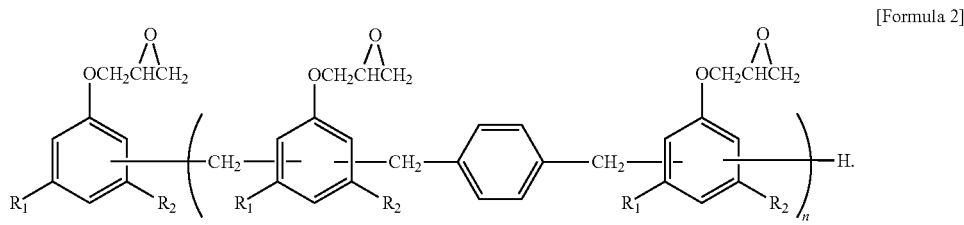

In Formula 2, R1 and R2 may each independently be hydrogen or a C1 to C4 linear or branched alkyl group, and n may have a value from 1 to 9 on average.

In an implementation, in Formula 1, R1 and R2 may be a methyl group, and the epoxy resin may have a structure represented by Formula 3:

[Formula 3]

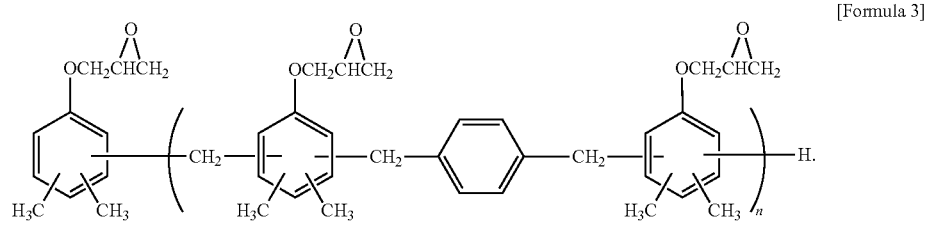

In Formula 3, n may be a value from 1 to 9 on average.

Preferably, R1 and R2 are a methyl group, which may provide the resin composition with improved flame retardancy as compared with using hydrogen, an ethyl group, a propyl group, or a butyl group as R1 and R2.

In an implementation, the epoxy resin represented by Formula 1 may have a structure represented by Formula 4:

[Formula 4]

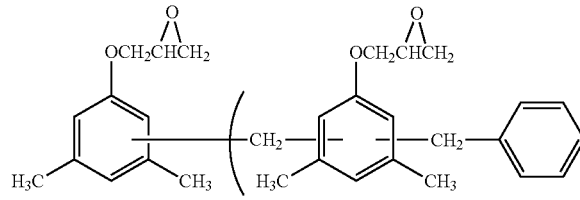

In Formula 4, n may be a value from 1 to 9 on average.

The epoxy resin represented by Formulas 1 to 4 may have good reliability and adhesion to various lead frames as compared with an epoxy resin such a phenol aralkyl epoxy resin, a xyloc epoxy resin, or a biphenyl epoxy resin.

The epoxy resin according to the present embodiment may provide the encapsulant with excellent moisture resistance, toughness, and crack resistance, and a low crosslinking density. Thus, flame retardancy may be provided through formation of a char layer when burned at a high temperature.

The epoxy resin may have an epoxy equivalent weight of about 100 to 350 g/eq. Within this range, the epoxy resin composition may provide an excellent balance between curing performance, flame retardancy, and fluidity. In an implementation, the epoxy equivalent weight may be about 200 to about 300 g/eq.

The epoxy resin may have a softening point of about 40 to about 120° C. The epoxy resin may have a melt viscosity of about 0.1 to about 3.0 poise at 150° C. Within this range of melt viscosity, fluidity does not deteriorate when melted and the moldability of the epoxy resin composition does not deteriorate.

The epoxy resin may be synthesized by a general method or be obtained from commercially available products.

The epoxy resin may be present in an amount of about 1 to about 13 wt % in the epoxy resin composition. Within this range, the epoxy resin composition can have good fluidity, flame retardancy, adhesion, and reliability. Specifically, the amount may be about 2 to about 9 wt %, preferably about 3 to about 7.5 wt %.

In an embodiment, the epoxy resin composition may include the aromatic hydrocarbon modified novolac epoxy resin as a first resin, and may another epoxy resin, as a second resin, the other epoxy resin being generally used in manufacturing an epoxy resin composition. For example, such the other epoxy resin may include a suitable epoxy resin having two or more epoxy groups, and may include, e.g., one or more of monomers, oligomers, and polymers having two or more epoxy groups.

The other epoxy resin may include, e.g., one or more of a phenol aralkyl epoxy resin, a biphenyl epoxy resin, a xyloc epoxy resin, an epoxy resin obtained by epoxidation of a condensate of a phenol or an alkyl phenol with hydroxybenzaldehyde, a phenol novolac type epoxy resin, a cresol novolac type epoxy resin, a multifunctional epoxy resin, a naphthol novolac type epoxy resin, a bisphenol A/bisphenol F/bisphenol AD novolac type epoxy resin, a bisphenol A/bisphenol F/bisphenol AD glycidyl ether resin, a bishydroxybiphenyl epoxy resin, a dicyclopentadiene epoxy resin, a polycyclic aromatic modified epoxy resin, a bisphenol A epoxy resin, an ortho-cresol novolac type epoxy resin, a naphthalene epoxy resin, etc.

In an implementation, a phenol aralkyl novolac epoxy resin including a biphenyl derivative represented in Formula 5, a biphenyl epoxy resin represented by Formula 6, and/or a xyloc epoxy resin represented by Formula 7 may be used as the other resin:

[Formula 5]

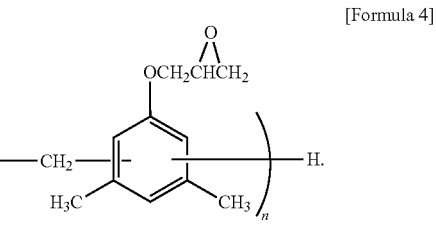

wherein n is a value from 1 to 7 on average;

[Formula 6]

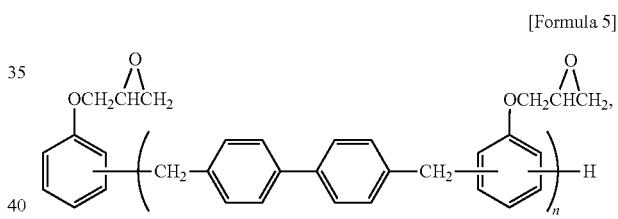

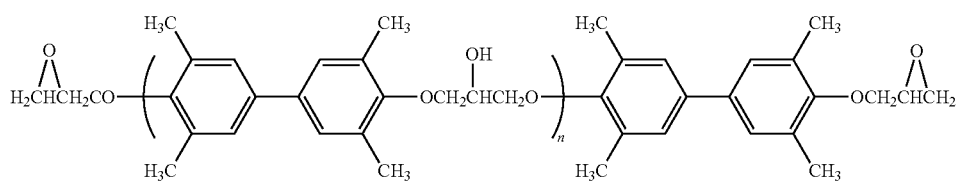

wherein n is a value from 0 to 7 on average; and

[Formula 7]

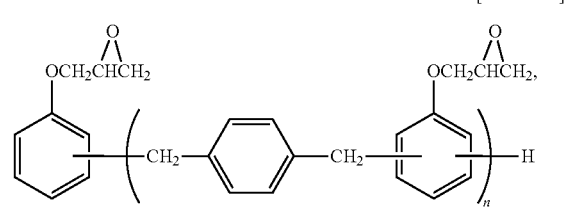

wherein n is a value from 1 to 7 on average.

The epoxy resin may include adducts, such as a melt masterbatch (MMB), obtained by pre-reaction of these epoxy resin with other additives, such as a curing agent, a curing accelerator, a release agent, a coupling agent, and the like When the epoxy resin composition includes both the epoxy resin represented by Formula 1 and the aforementioned other epoxy resin, the epoxy resin represented in Formula 1 may be present in an amount of about 30 wt % or more based on the total amount of the epoxy resin. Within this range, the epoxy resin composition may provide flame retardancy and have good adhesion, reliability, and fluidity. In an implementation, the amount may be about 40 wt % or more, preferably about 50 wt % or more.

The epoxy resin in Formula 1 alone, or a mixture thereof, may be present in an amount of about 1 to about 13 wt % in the epoxy resin composition.

Curing Agent

The curing agent may include a suitable curing agent that is generally used for semiconductor encapsulation and contains two or more phenolic hydroxyl groups. The curing agent may be at least one selected from the group of monomers, oligomers, and polymers containing at least two phenolic hydroxyl groups.

Examples of the curing agent may include, e.g., a phenol aralkyl type phenolic resin, a xyloc type phenolic resin, a phenol novolac type phenolic resin, a cresol novolac type phenolic resin, a naphthol type phenolic resin, a terpene type phenolic resin, a multifunctional phenolic resin, a polycyclic aromatic phenolic resin, a dicyclopentadiene phenolic resin, a terpene modified phenolic resin, a dicyclopentadiene modified phenolic resin, a novolac type phenolic resin synthesized from bisphenol A and cresol, a polyhydric phenolic compound including tris(hydroxyphenyl)methane, dihydroxybiphenyl, an acid anhydride such as maleic anhydride or phthalic anhydride, an aromatic amine such as meta-phenylenediamine, diaminodiphenylmethane, or diaminodiphenylsulfone, etc.

In an implementation, a phenol aralkyl type phenolic resin in a novolac structure containing a biphenyl derivative represented by Formula 8 and/or a xyloc type phenolic resin represented by Formula 9 may be used as the curing agent:

[Formula 8]

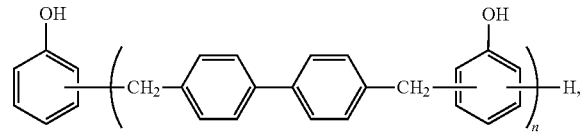

wherein n is a value from 1 to 7 on average; and

[Formula 9]

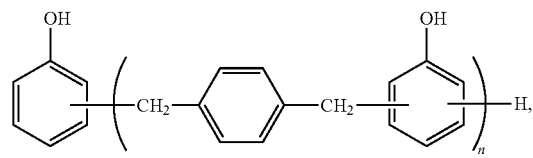

wherein n is a value from 1 to 7 on average.

The curing agent may be used alone or in combinations thereof. Further, the curing agent may also be adducts, such as an MMB, obtained by pre-reaction of these curing agents with the above epoxy resin, curing accelerators, and other additives.

The curing agent may have a softening point of about 50 to 100° C. Within this range, the epoxy resin composition may provide a suitable viscosity, and fluidity may be maintained.

The phenolic hydroxyl groups included in the curing agent may have an equivalent weight of about 90 to 300 g/eq.

As to a ratio between the epoxy resin and the curing agent, a ratio of the equivalent weight of epoxy groups in the epoxy resin to the equivalent weight of phenolic hydroxyl groups in the curing agent may be about 0.5:1 to about 2:1. Within this range, the resin composition may provide fluidity without delaying curing. In an implementation, the equivalent weight ratio may be about 0.8:1 to about 1.6:1.

The curing agent may be present in an amount of about 1.5 to about 10 wt % in the epoxy resin composition. Within this range, unreacted epoxy groups and phenolic hydroxyl groups may be reduced or avoided, providing good reliability. In an implementation, the curing agent may be present in an amount of about 2 to 8 wt % in the epoxy resin composition.

Curing Accelerator

The curing accelerator promotes a reaction between the epoxy resin and the curing agent. The curing accelerator may include one or more suitable curing accelerators. For example, the curing accelerator may include tertiary amines, organometallic compounds, organic phosphorus compounds, imidazole compounds, boron compounds, or the like. Preferably, the curing accelerators may be the organic phosphorus compounds.

Examples of the tertiary amines may include benzyldimethylamine, triethanolamine, triethylenediamine, dimethylaminoethanol, tri(dimethylaminomethyl)phenol, 2-2-(dimethylaminomethyl)phenol, 2,4,6-tris(diaminomethyl)phenol, salts of tri-2-ethylhexanoic acid, etc. Examples of the organometallic compounds may include chromium acetylacetonate, zinc acetylacetonate, nickel acetylacetonate, etc. Examples of the organic phosphorus compounds may include tris-4-methoxyphosphine, tetrabutylphosphonium bromide, butyltriphenylphosphonium bromide, phenylphosphine, diphenylphosphine, triphenylphosphine, triphenylphosphine triphenylborane, triphenylphosphine-1,4-benzoquinone adducts, etc. Examples of the imidazole compounds may include 2-methylimidazole, 2-phenylimidazole, 2-aminoimidazole, 2-methyl-1-vinylimidazole, 2-ethyl-4-methylimidazole, 2-heptadecylimidazole, etc. Examples of the boron compounds may include tetraphenylphosphonium-tetraphenylborate, triphenylphosphine tetraphenylborate, a tetraphenylboron salt, trifluoroborane-n-hexylamine, trifluoroborane monoethylamine, tetrafluoroborane triethylamine, tetrafluoroborane amine, etc. In addition, there may be used salts of 1,5-diazabicyclo[4.3.0]non-5-ene (DBN) and 1,8-diazabicyclo[5.4.0]undec-7-ene (DBU), and phenol novolac resin salts.

The curing accelerator may also be adducts obtained from pre-reaction with the epoxy resin and/or the curing agent.

The curing accelerator may be present in an amount of about 0.001 to 1.5 wt % in the epoxy resin composition. Within this range, curing may not be delayed and the composition may provide fluidity. Specifically, the amount may be about 0.01 to 1 wt %.

Inorganic Filler

The inorganic fillers maybe used to improve mechanical properties and to reduce stress. Examples of the inorganic fillers may include fused silica, crystalline silica, calcium carbonate, magnesium carbonate, alumina, magnesia, clay, talc, calcium silicate, titanium oxide, antimony oxide, and glass fiber, etc. Specifically, fused silica having a low coefficient of linear expansion may be used to reduce stress.

Fused silica refers to amorphous silica having a specific gravity of about 2.3 or less, which may be prepared by melting crystalline silica or by synthesis from various raw materials.

For use, the inorganic fillers may be subjected to surface treatment with one or more coupling agents selected from the group of epoxy silane, aminosilane, mercaptosilane, alkyl silane, and alkoxysilane.

In an implementation, spherical fused silica having an average particle size of about 0.001 to 30 μm may be used. In an implementation, the inorganic fillers may be a mixture of spherical fused silica having different particle sizes.

In various implementations, the maximum particle size of the inorganic fillers may be, e.g., 45 μm, 55 μm, 75 μm, etc., depending on uses of the resin composition and the composition of a lead frame.

The inorganic fillers may be added in a suitable ratio in consideration of physical properties (such as moldability, stress, and temperature resistance) of the epoxy resin composition. For example, the inorganic fillers may be present in an amount of about 78 to 94 wt % in the epoxy resin composition. Within this range, flame retardancy, fluidity, and reliability can be secured. In an implementation, the amount may be about 82 to 92 wt %.

Additives

The epoxy resin composition may further include additives, such as colorants, coupling agents, release agents, stress-reducing agents, flame retardants, crosslinking promoters, auxiliary flame retardants, and leveling agents.

Examples of the colorants may include carbon black, organic dyes, or inorganic dyes, etc. Examples of the coupling agents may include one or more of an epoxy silane, an aminosilane, a mercaptosilane, an alkyl silane, an alkoxysilane, etc. Examples of the release agents may include paraffin waxes, ester waxes, higher fatty acids, higher fatty acid metal salts, natural fatty acids, natural fatty acid metal salts, etc. Examples of the stress-reducing agents may include modified silicone oil, silicone elastomers, silicone powder, silicone resin, etc. Examples of the flame retardant may include organic and inorganic flame retardants (such as bromine or phosphorus flame retardants), phosphagen, zinc borate, aluminum hydroxide, magnesium hydroxide, etc.

The additive may be present in an amount of, e.g., about 0.1 to 5 wt % in the epoxy resin composition.

The epoxy resin composition may be suitably prepared. In an implementation, the epoxy resin composition may be prepared by uniformly mixing the components included in the composition using a Henschel or Redige mixer, melt-kneading the mixture at about 90 to 120° C. using a roll mill or a kneader, and cooling and grinding the mixture. As a method of encapsulating a semiconductor device using the epoxy resin composition, low-pressure transfer molding may generally be employed. In addition, injection molding or casting may also be used. Using these methods, a semiconductor device having a copper lead frame, an iron lead frame, a lead frame obtained by pre-plating these lead frames with, e.g., nickel, copper, and/or palladium, or an organic laminate frame may be manufactured.

Another embodiment provides a semiconductor device encapsulated using the epoxy resin composition for encapsulating the semiconductor device. A general method of encapsulating the semiconductor device using the composition may be used.

The following Examples and Comparative Examples are provided in order to set forth particular details of one or more embodiments. However, it will be understood that the embodiments are not limited to the particular details described. Further, the Comparative Examples are set forth to highlight certain characteristics of certain embodiments, and are not to be construed as either limiting the scope of the invention as exemplified in the Examples or as necessarily being outside the scope of the invention in every respect.

Details of components used in Examples and Comparative Examples are as follows.

1. As epoxy resin, KSE-3210 (Kukdo Chemical Co., Ltd.) as an epoxy resin represented by Formula 4, NC-3000 (Nippon Kayaku Co., Ltd.) as a phenol aralkyl epoxy resin, YH-4000H (Mitsubishi Chemical Corporation) as a biphenyl epoxy resin, and NC-2000-L (Nippon Kayaku Co., Ltd.) as a xyloc epoxy resin were used.

2. As curing agents, MEH-7851SS (Meiwa Kasei Industries) as a phenol aralkyl phenolic resin and HE 100C-10 (Air Water Inc.) as a xyloc phenolic resin were used.

3. As a curing accelerator, triphenylphosphine (TPP, Hokko Chemical) was used.

4. As inorganic fillers, a mixture of spherical fused silica having an average particle size of 18 μm and spherical fused silica having an average particle size of 0.5 μm at a weight ratio of 9:1 was used.

5. As coupling agents, KBM-803 (Shin-Etsu Chemical) as mercaptopropyltrimethoxysilane and SZ-6070 (Dow Corning Chemical) as methyltrimethoxysilane were used.

6. As a release agent, carnauba wax was used.

7. As a colorant, carbon black, MA-600 (Matsushita Chemical), was used.

EXAMPLES 1 to 3

The epoxy resin, curing agent, curing accelerator, inorganic filler, coupling agent, colorants, and release agent were added according to compositions listed in Table 1 and uniformly mixed using a Henschel mixer. The mixture was melt-kneaded at 95° C. using a continuous kneader and then was cooled and ground, thereby producing epoxy resin compositions for encapsulating a semiconductor device.

COMPARATIVE EXAMPLES 1 to 3

Epoxy resin compositions for encapsulating a semiconductor device were prepared in the same manner as in Examples except that epoxy resin, curing agent, curing accelerator, inorganic filler, coupling agent, colorant, and release agent were used according to compositions listed in Table 1.

TABLE 1

(Unit: wt %)

| Composition | | Ex. 1 | Ex. 2 | Ex. 3 | Comp. Ex. 1 | Comp. Ex. 2 | Comp. Ex. 3 |
|---|---|---|---|---|---|---|---|
| Epoxy resin | Aromatic hydrocarbon modified novolac | 7.11 | 6.45 | 3.23 | — | — | — |
| | Phenol arakyl | — | — | — | 6.74 | — | — |
| | Biphenyl | — | — | 3.23 | — | 5.79 | — |
| | Xyloc | — | — | — | — | — | 6.36 |
| Curing agent | Phenol arakyl | — | 5.45 | 2.72 | 5.16 | 6.11 | 5.54 |
| | Xyloc | 4.79 | — | 2.72 | — | — | — |
| Curing accelerator | | 0.2 | 0.2 | 0.2 | 0.2 | 0.2 | 0.2 |
| Inorganic filler | | 87 | 87 | 87 | 87 | 87 | 87 |
| Coupling agent | Mercaptosilane | 0.2 | 0.2 | 0.2 | 0.2 | 0.2 | 0.2 |
| | Alkoxysilane | 0.2 | 0.2 | 0.2 | 0.2 | 0.2 | 0.2 |
| Colorant | | 0.3 | 0.3 | 0.3 | 0.3 | 0.3 | 0.3 |
| Release agent | | 0.2 | 0.2 | 0.2 | 0.2 | 0.2 | 0.2 |

Experiment: Evaluation of Physical Properties of Epoxy Resin Compositions

The epoxy resin compositions prepared in Examples and Comparative Examples were evaluated in terms of the following properties listed in Table 2 and the results are shown in Table 2.

<Evaluation>

1. Fluidity

The flow length of each composition was measured using a measurement mold and a transfer molding press at 175° C. and 70 kgf/cm² according to EMMI-1-66. Higher values represent better fluidity.

2. Flame Retardancy

Flame retardancy was evaluated using a specimen having a thickness of ⅛ inch according to the UL-94V standard.

3. Adhesive Strength

A copper substrate, an Alloy 42 substrate, and a silver-plated copper substrate which had a suitable size for a mold for measuring adhesive strength were prepared. Each of the resin compositions prepared in Examples and Comparative Examples was molded with each of the specimens at a mold temperature of 170 to 180° C., a transfer pressure of 1,000 psi, and a transfer rate of 0.5 to 1 cm/s for a curing time of 120 seconds, thereby preparing a cured sample. This sample was put in an oven at 170 to 180° C. and underwent post-mold curing (PMC) for 4 hours, and then was left at room temperature for 30 min, followed by measurement of adhesive strength. Here, the area of the epoxy resin composition in contact with the sample was 40±1 mm², and adhesive strength was obtained by measuring 12 samples per process using a universal testing machine (UTM) and calculating an average value.

4. Reliability

Each of the epoxy resin compositions prepared in the Examples and Comparative Examples was transfer-molded at 175° C. for 60 seconds using a multi-plunger system (MPS), thereby preparing a 32-Small Outline Package (SOP) including a copper substrate. The package was subjected to PMC at 175° C. for 4 hours and cooled to 25° C. Then, the package was dried at 125° C. for 24 hours, and then subjected to 5 cycles of thermal shock testing (1 cycle means that the package was left at −65° C. for 10 minutes, at 25° C. for 10 minutes and at 150° C. for 10 minutes). Subsequently, the package was subjected to pre-conditioning, that is, the package was left at 85° C. and 85 RH % for 168 hours and then passed through IR reflow at 260° C. for 30 seconds three times, followed by observation of the package using an optical microscope to identify whether cracks appeared. Using a non-destructive tester, Scanning Acoustic Microscopy (SAM), occurrence of peeling of the epoxy resin composition from the lead frame was evaluated.

TABLE 2

| Categories | | Ex. 1 | Ex. 2 | Ex. 3 | Comp. Ex. 1 | Comp. Ex. 2 | Comp. Ex. 3 |
|---|---|---|---|---|---|---|---|
| Fluidity (inch) | | 54 | 58 | 71 | 53 | 82 | 51 |
| Flame retardancy | | V-0 | V-0 | V-0 | V-0 | V-1 | V-1 |
| Adhesive strength (kgf) | Copper substrate | 80 | 83 | 88 | 78 | 87 | 73 |
| | Alloy 42 substrate | 56 | 57 | 59 | 50 | 62 | 46 |
| | Silver-plated copper substrate | 89 | 84 | 85 | 70 | 80 | 64 |
| Reliability | Number of cracks | 0 | 0 | 0 | 0 | 0 | 0 |
| | Number of peelings | 0 | 0 | 0 | 2 | 29 | 32 |
| | Total number of semiconductor devices tested | 80 | 80 | 80 | 80 | 80 | 80 |

As shown Table 2, the compositions including the epoxy resin according to embodiments provided good adhesion and flame retardancy as compared with the compositions not including the epoxy resin. Further, the compositions including the epoxy resin according to embodiments may provide a flame retardancy of V-0 as compared with the composition including the xyloc epoxy resin according to Comparative Example 3. Also, these compositions provided excellent reliability due to proper peel resistance.

By way of summation and review, brominated epoxy resin and antimony trioxide ($Sb_2O_3$) are generally used for preparing an epoxy resin composition for encapsulating a semiconductor device in order to secure flame retardancy. However, the epoxy resin composition using halogen flame retardants may generates toxic carcinogens (such as dioxin or difuran) when combusted. Further, when combusted, the halogen flame retardants may generate gases (such as HBr and HCl) that are harmful to humans, and cause corrosion of a semiconductor chip or wire and a lead frame.

Non-halogen organic flame retardants and inorganic retardants have been considered, e.g., organic flame retardants such as phosphorus-containing flame retardants like phosphazene and phosphate ester, and nitrogen atom-containing resins. However, nitrogen atom-containing resins may have to be used in large amounts to provide sufficient flame retardancy. Organic phosphorus flame retardants may provide excellent flame retardancy and good thermal properties, but inorganic phosphorus flame retardants may combine with water to form phosphoric acid and polyphosphoric acid, which deteriorate reliability. Thus, the semiconductor industry restricts use of organic phosphorus flame retardants (although organic phosphoric flame retardants may not generate phosphoric acid and polyphosphoric acid).

Further, inorganic flame retardants such as magnesium hydroxide or zinc borate may deteriorate curing of epoxy resin compositions, decreasing in moldability. Thus, epoxy resin and curing agents constituting epoxy resin compositions for encapsulation should provide some degree of flame retardancy in order to minimize use of inorganic flame retardants.

When a semiconductor package is exposed to high temperature (e.g., 260° C.) while being mounted on a substrate, peeling may occur inside the package, or breakage may occur outside the package due to significant volumetric expansion of moisture in the package. Thus, an epoxy resin composition having excellent adhesion and moisture resistance, and good reliability is important. An epoxy resin composition for encapsulating a semiconductor device that provides excellent flame retardancy without using a flame retardant, that exhibits good adhesion to other materials constituting a semiconductor package, and that exhibits suitable reliability and fluidity would be useful.

As described above, embodiments relate to an epoxy resin composition for encapsulating a semiconductor device and a semiconductor device encapsulated with the same. Embodiments may provide an epoxy resin composition for encapsulating a semiconductor device, and a semiconductor device encapsulated with the same, which includes an epoxy resin having a particular structure to secure excellent flame retardancy without using a flame retardant. Embodiments may provide environmental friendliness, and good fluidity, adhesion, and reliability.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An epoxy resin composition for encapsulating a semiconductor device, the composition comprising:
   a curing agent;
   a curing accelerator;
   an inorganic filler; and
   an epoxy resin, the epoxy resin including a first resin represented by Formula 1:

[Formula 1]

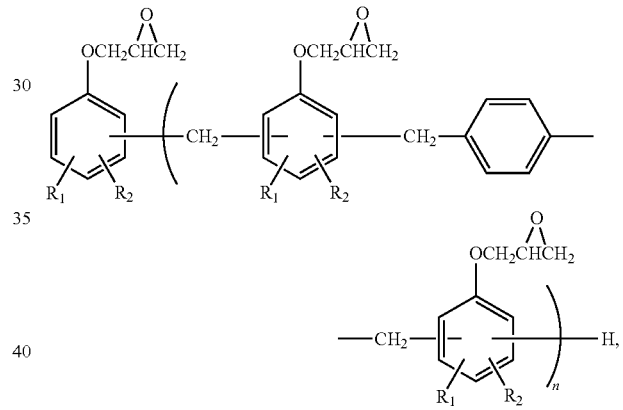

wherein:
R1 and R2 are each independently hydrogen or a C1 to C4 linear or branched alkyl group, and n is a value from 1 to 9 on average, and
the epoxy resin is present in an amount of about 1 to about 13 wt % in the composition.

2. The composition as claimed in claim 1, wherein the first resin represented by Formula 1 has a structure represented by Formula 2:

[Formula 2]

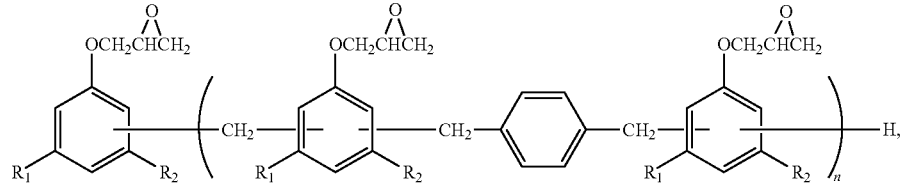

wherein R1 and R2 each independently are hydrogen or a C1 to C4 linear or branched alkyl group, and n is a value from 1 to 9 on average.

3. The composition as claimed in claim 1, wherein the first resin represented by Formula 1 has a structure represented by Formula 3:

[Formula 3]

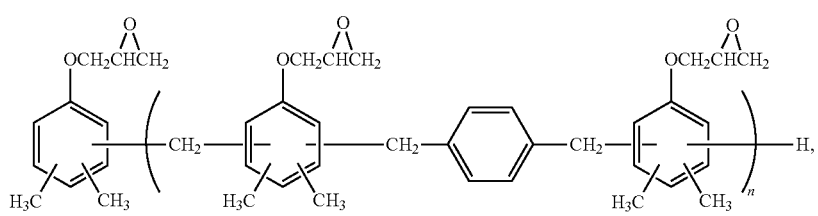

wherein n is a value from 1 to 9 on average.

4. The composition as claimed in claim 1, wherein the first resin represented by Formula 1 has a structure represented by Formula 4:

[Formula 4]

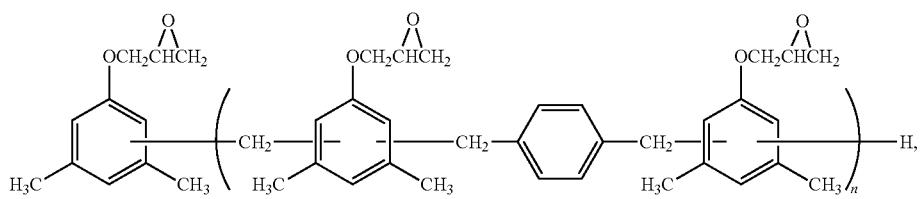

wherein n is a value from 1 to 9 on average.

5. The composition as claimed in claim 1, wherein the epoxy resin includes about 30 wt % or more of the first resin represented by Formula 1.

6. The composition as claimed in claim 1, wherein the epoxy resin further includes a second resin selected from the group of a phenol aralkyl epoxy resin, a biphenyl epoxy resin, a xyloc epoxy resin, an epoxy resin obtained by epoxidation of a condensate of a phenol or an alkyl phenol with hydroxybenzaldehyde, a phenol novolac epoxy resin, a cresol novolac epoxy resin, a multifunctional epoxy resin, a naphthol novolac epoxy resin, a bisphenol A/bisphenol F/bisphenol AD novolac epoxy resin, a bisphenol A/bisphenol F/bisphenol AD glycidyl ether resin, a bishydroxybiphenyl epoxy resin, a dicyclopentadiene epoxy resin, a polycyclic aromatic modified epoxy resin, a bisphenol A epoxy resin, an orthocresol novolac epoxy resin, and a naphthalene epoxy resin.

7. The composition as claimed in claim 1, wherein the composition includes about 1.5 to about 10 wt % of the curing agent, about 0.001 to about 1.5 wt % of the curing accelerator, and about 78 to about 94 wt % of the inorganic filler.

8. The composition as claimed in claim 1, wherein the curing agent includes one or more of a phenol aralkyl phenolic resin, a xyloc phenolic resin, a phenol novolac phenolic resin, a cresol novolac phenolic resin, a naphthol phenolic resin, a terpene phenolic resin, a multifunctional phenolic resin, a polycyclic aromatic phenolic resin, a dicyclopentadiene phenolic resin, a terpene modified phenolic resin, a dicyclopentadiene modified phenolic resin, a novolac phenolic resin synthesized from bisphenol A and cresol, a polyhydric phenolic compound including tris(hydroxyphenyl)methane, dihydroxybiphenyl, an acid anhydride, and an aromatic amine.

9. The composition as claimed in claim 1, wherein the curing accelerator includes one or more of benzyldimethylamine, triethanolamine, triethylenediamine, dimethylaminoethanol, tri(dimethylaminomethyl)phenol, 2,2-(dimethylaminomethyl)phenol, 2,4,6-tris(diaminomethyl)phenol, a salt of tri-2-ethylhexanoic acid, chromium acetylacetonate, zinc acetylacetonate, nickel acetylacetonate, tris-4-methoxyphosphine, tetrabutylphosphonium bromide, butyltriphenylphosphonium bromide, phenylphosphine, diphenylphosphine, triphenylphosphine, triphenylphosphine triphenylborane, a triphenylphosphine-1,4-benzoquinone adduct, 2-methylimidazole, 2-phenylimidazole, 2-aminoimidazole, 2-methyl-1-vinylimidazole, 2-ethyl-4-methylimidazole, 2-heptadecylimidazole, tetraphenylphosphonium-tetraphenylborate, triphenylphosphine tetraphenylborate, a tetraphenylboron salt, trifluoroborane-n-hexylamine, trifluoroborane monoethylamine, tetrafluoroborane triethylamine, tetrafluoroborane amine, a salt of 1,5-diazabicyclo[4.3.0]non-5-ene (DBN), a salt of 1,8-diazabicyclo[5.4.0]undec-7-ene (DBU), and a phenol novolac resin salt.

10. The composition as claimed in claim 1, wherein the composition consists essentially of:
about 3 to about 7.5 wt % of the first resin represented by Formula 1, the first resin represented by Formula 1 having a structure represented by Formula 4:

[Formula 4]

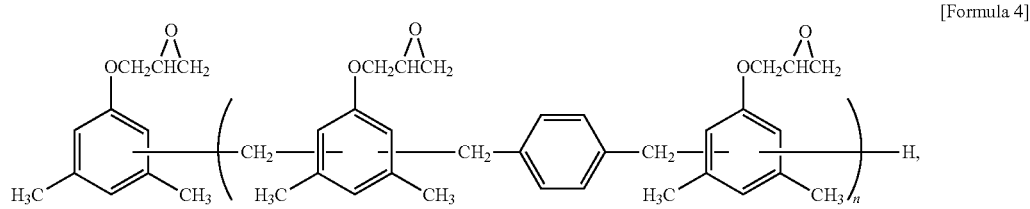

wherein n is a value from 1 to 9 on average;

about 2 to about 8 wt % of the curing agent, the curing agent being a resin represented by Formula 9:

[Formula 9]

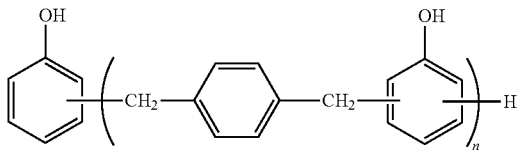

wherein n is a value from 1 to 7 on average;
about 0.01 to about 1 wt % of triphenylphosphine;
about 82 to about 92 wt % of a mixture of: spherical fused silica having an average particle size of 18 μm and spherical fused silica having an average particle size of 0.5 μm at a weight ratio of about 9:1; and about 0.1 wt % to about 5 wt % of a mixture of: a colorant, a release agent, mercaptopropyltrimethoxysilane, and methyltrimethoxysilane.

11. The composition as claimed in claim 1, wherein the composition consists essentially of:

about 3 to about 7.5 wt % of the first resin represented by Formula 1, the first resin represented by Formula 1 having a structure represented by Formula 4:

[Formula 4]

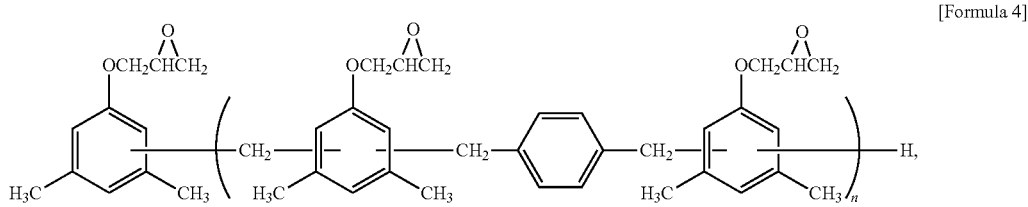

wherein n is a value from 1 to 9 on average;
about 2 to about 8 wt % of the curing agent, the curing agent being a resin represented by Formula 8:

[Formula 8]

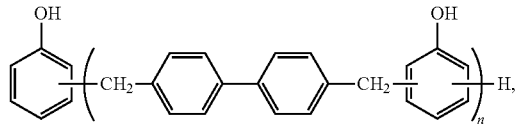

wherein n is a value from 1 to 7 on average;
about 0.01 to about 1 wt % of triphenylphosphine;
about 82 to about 92 wt % of a mixture of: spherical fused silica having an average particle size of 18 μm and spherical fused silica having an average particle size of 0.5 μm at a weight ratio of about 9:1; and
about 0.1 wt % to about 5 wt % of a mixture of: a colorant, a release agent, mercaptopropyltrimethoxysilane, and methyltrimethoxysilane.

12. The composition as claimed in claim 1, wherein the composition consists essentially of:

about 3 to about 7.5 wt % of a mixture of: the first resin represented by Formula 1 and a second resin, the first resin represented by Formula 1 having a structure represented by Formula 4:

[Formula 4]

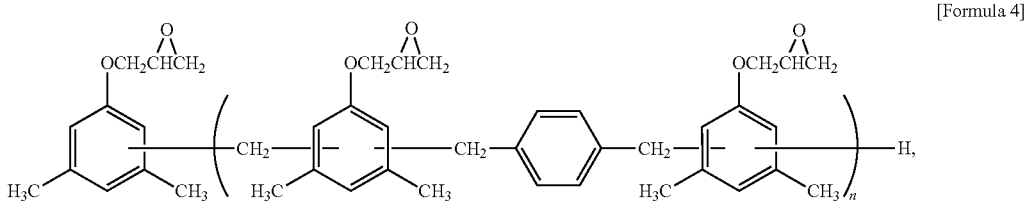

wherein n is a value from 1 to 9 on average,
the second resin having a structure represented by Formula 5 or Formula 6:

[Formula 5]

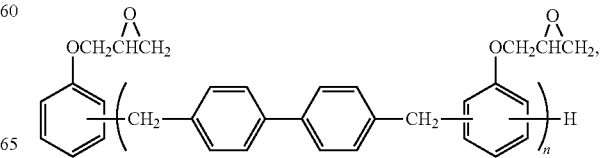

wherein n is a value from 1 to 7 on average,

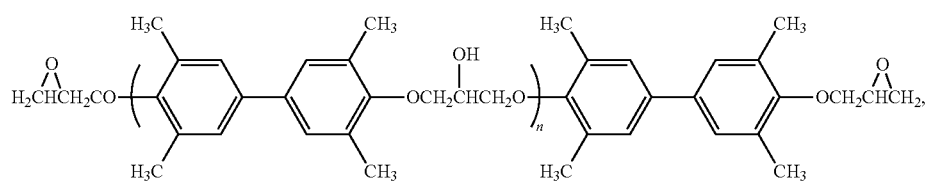

wherein n is a value from 1 to 7 on average;

about 2 to about 8 wt % of the curing agent, the curing agent being a mixture of: a resin represented by Formula 8 and a resin represented by Formula 9:

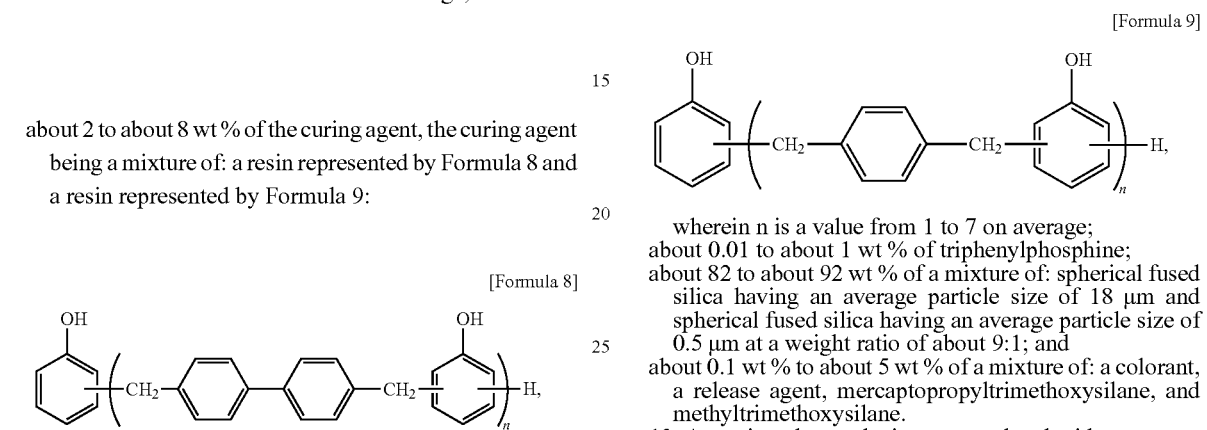

wherein n is a value from 1 to 7 on average;
about 0.01 to about 1 wt % of triphenylphosphine;
about 82 to about 92 wt % of a mixture of: spherical fused silica having an average particle size of 18 μm and spherical fused silica having an average particle size of 0.5 μm at a weight ratio of about 9:1; and
about 0.1 wt % to about 5 wt % of a mixture of: a colorant, a release agent, mercaptopropyltrimethoxysilane, and methyltrimethoxysilane.

13. A semiconductor device encapsulated with an encapsulant formed from the composition as claimed in claim 1.

* * * * *